(12) United States Patent
Mahajan et al.

(10) Patent No.: US 11,114,599 B2
(45) Date of Patent: Sep. 7, 2021

(54) ELECTRONIC DEVICES INCLUDING SOLID SEMICONDUCTOR DIES

(71) Applicant: 3M INNOVATIVE PROPERTIES COMPANY, St. Paul, MN (US)

(72) Inventors: Ankit Mahajan, St. Paul, MN (US); Mikhail L. Pekurovsky, Bloomington, MN (US); Matthew S. Stay, Minneapolis, MN (US); Shawn C. Dodds, St. Paul, MN (US); Thomas J. Metzler, St. Paul, MN (US); Matthew R. D. Smith, Woodbury, MN (US); Saagar A. Shah, Woodbury, MN (US); Jae Yong Lee, Santa Clara, CA (US); James F. Poch, New Richmond, WI (US); Roger W. Barton, Afton, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 81 days.

(21) Appl. No.: 16/498,478

(22) PCT Filed: Mar. 22, 2018

(86) PCT No.: PCT/IB2018/051949
§ 371 (c)(1),
(2) Date: Sep. 27, 2019

(87) PCT Pub. No.: WO2018/178821
PCT Pub. Date: Oct. 4, 2018

(65) Prior Publication Data
US 2020/0105991 A1   Apr. 2, 2020

Related U.S. Application Data

(60) Provisional application No. 62/479,796, filed on Mar. 31, 2017.

(51) Int. Cl.
*H01L 35/04* (2006.01)
*H01L 35/34* (2006.01)
(Continued)

(52) U.S. Cl.
CPC .............. *H01L 35/04* (2013.01); *H01L 35/32* (2013.01); *H01L 35/34* (2013.01);
(Continued)

(58) Field of Classification Search
CPC ......... H01L 35/04; H01L 35/34; H01L 35/32; H01L 25/072; H01L 21/568;
(Continued)

(56) References Cited

U.S. PATENT DOCUMENTS 9,401,350 B1 * 7/2016 We ......................... H01L 23/13
2002/0069906 A1   6/2002 Macris
(Continued)

FOREIGN PATENT DOCUMENTS

CN         104425395 A  *  3/2015
JP         08018109         1/1996
(Continued)

OTHER PUBLICATIONS

Translation of Kishi et al. (JP08-018109) (Year: 1997).*
International Search Report for PCT International Application No. PCT/162018/051949, dated Nov. 19, 2018, 3 pages.

*Primary Examiner* — Selim U Ahmed
*Assistant Examiner* — Evan G Clinton
(74) *Attorney, Agent, or Firm* — Yufeng Dong

(57) ABSTRACT

Electronic devices including a layer of polymeric material and solid semiconductor dies partially embedded in the layer are provided. The dies have first ends projecting away from
(Continued)

the first major surface of the layer. The electronic devices can be formed by sinking the first ends of the dies into a major surface of a liner. A flowable polymeric material is filled into the space between the dies and solidified to form the layer of polymeric material. The first ends of the dies are exposed by delaminating the liner from the first ends of the dies. Electrical conductors are provided on the layer to connect the first ends of the dies.

18 Claims, 6 Drawing Sheets

(51) Int. Cl.
*H01L 35/32* (2006.01)
*H01L 21/762* (2006.01)
*H01L 21/768* (2006.01)
*H01L 21/603* (2006.01)

(52) U.S. Cl.
CPC .. *H01L 21/76224* (2013.01); *H01L 21/76828* (2013.01); *H01L 2021/603* (2013.01)

(58) Field of Classification Search
CPC ......... H01L 23/293; H01L 23/28–3192; H01L 21/56–568; H01L 2924/181–186
See application file for complete search history.

(56) References Cited

U.S. PATENT DOCUMENTS

| | | | |
|---|---|---|---|
| 2015/0325491 A1* | 11/2015 | Aleksov | H01L 23/564 |
| | | | 257/784 |
| 2016/0027984 A1 | 1/2016 | Shiraishi | |
| 2017/0025582 A1* | 1/2017 | Dai | H01L 33/505 |
| 2017/0033272 A1* | 2/2017 | Pedaci | H01L 35/34 |
| 2017/0048986 A1 | 2/2017 | Mei | |
| 2018/0197767 A1* | 7/2018 | Yue | H05K 13/0404 |

FOREIGN PATENT DOCUMENTS

| | | |
|---|---|---|
| JP | 2014093342 | 5/2014 |
| WO | WO 2017-222853 | 12/2017 |
| WO | WO 2017-222862 | 12/2017 |
| WO | WO 2017-223278 | 12/2017 |

* cited by examiner

ELECTRONIC DEVICES INCLUDING SOLID SEMICONDUCTOR DIES

CROSS REFERENCE TO RELATED APPLICATIONS

This application is a national stage filing under 35 U.S.C. 371 of PCT/IB2018/051949, filed Mar. 22, 2018, which claims the benefit of U.S. Application No. 62/479,796, filed Mar. 31, 2017, the disclosure of which is incorporated by reference in its/their entirety herein.

TECHNICAL FIELD

The present disclosure relates to electronic devices (e.g., thermoelectric devices) including solid semiconductor dies, and methods of making and using the same.

BACKGROUND

Solid semiconductor dies are available to be integrated into various electronic devices. For example, a ceramic thermoelectric module can be made by placing an array of solid thermoelectric dies between two parallel ceramic substrates. Electrodes can be formed on the ceramic substrates to electrically connect legs of the thermoelectric dies by soldering or brazing, which is typically a manual assembly process.

SUMMARY

There is a desire to fabricate electronic devices including solid semiconductor dies in a large-area format and cost-effective ways. Briefly, in one aspect, the present disclosure describes a method including providing an array of solid semiconductor dies each extending between a first end and an opposite, second end thereof, sinking the first ends of the dies into a major surface of a first liner, filling a flowable polymeric material onto the major surface of the first liner, and solidifying the polymeric material to form a layer of polymeric matrix material. The array of solid semiconductor dies are at least partially embedded in the layer. The method further includes delaminating the first liner from the first ends of the dies to expose the first ends of the dies, and electrically connecting the exposed first ends of the dies.

In another aspect, the present disclosure describes an electronic film device including a layer of polymer matrix material, the layer having opposite first and second major surfaces, and an array of solid semiconductor dies being at least partially embedded in the layer. The dies each extend between a first end and a second end thereof. The first ends project away from the first major surface of the layer. A first electrical conductor extends on the first major surface of the layer to connect the first ends of the dies.

In another aspect, the present disclosure describes a flexible thermoelectric module including a layer of flexible polymer material, the layer having opposite first and second major surfaces, and an array of solid thermoelectric dies being at least partially embedded in the layer. The dies each extend between a first end and a second end thereof. Both ends are exposed from the layer of flexible polymer material. At least one of the first and second ends projects away from the layer. A first electrical conductor extends on the first major surface of the layer to connect the first ends of the array of dies. A second electrical conductor extends on the first major surface of the layer to connect the second ends of the array of dies.

Various unexpected results and advantages are obtained in exemplary embodiments of the disclosure. One such advantage of exemplary embodiments of the present disclosure is that electronic devices including solid semiconductor dies can be fabricated in a large-area format and cost-effective ways. The solid semiconductor dies can be integrated with a flexible polymer layer, which can result in flexible electronic devices. The processes of fabricating flexible electronic devices can include a roll-to-roll (R2R) process, which can effectively reduce the thickness of electronic film devices, provide flexible, large-area electronic devices, and reduce the processing cost.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
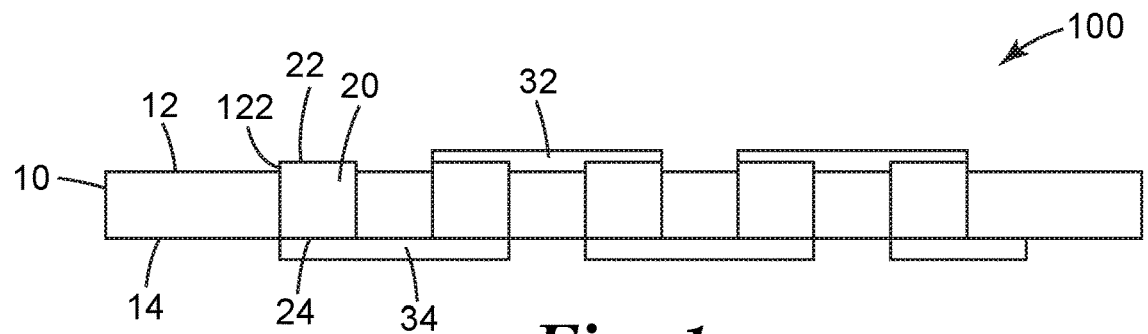
FIG. 1 is a cross sectional view of an electronic device, according to one embodiment of the present disclosure.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should understood that:

The term "flowable polymeric material" refers to a liquid composition such as an ink composition, or a molten or semi-molten polymeric material.

The term "liner" refers to a substrate having a major surface that is deformable to accommodate a sinking of an end of a solid semiconductor die and is capable of forming a fluid seal between the major surface and the end of the die.

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

The terms "about" or "approximately" with reference to a numerical value or a shape means +/− five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

FIG. 1 illustrates a cross-sectional view of an article 100. The article 100 includes a layer 10 of polymeric material having opposite first and second major surfaces 12 and 14. In some embodiments, the layer 10 can be a flexible layer of polymer matrix material, which can be, for example, a curing product of a curable polymer material. The suitable curable polymer material may include, for example, a polyurethane acrylate, a polydimethylsiloxane, a polyurethane rubber, a polyolefin foam, etc. The layer 10 have a thickness of, for example, about 10 microns to about 0.5 cm.

An array of solid semiconductor dies 20 is at least partially embedded in the polymer layer 10. The solid semiconductor dies 20 each extend between a first end 22 and a second end 24 thereof. The first ends 22 project away from the first major surface 12 of the layer 10. In some embodiments, the first ends 22 of the dies 20 project away from the first major surface 12 of the polymer layer 10 with a step 122. The step 122 may have an average height of about 1 to about 100 microns, about 1 to about 50 microns, about 1 to about 25 microns, or about 2 to about 25 microns. The first ends 22 of the dies 20 are electrically connected by a first electrical conductor 32. The second ends 24 of the dies 20 are electrically connected by a second electrical conductor 34. The array of dies 20 can include any number (e.g., one, two, three or more) of dies. The dies 20 can be regularly or randomly arranged.

The article 100 of FIG. 1 can be an electronic device such as, for example, a thermoelectric device, an optoelectronic device, etc., which may depend on the types of the solid semiconductor dies 20. In some embodiments, the solid semiconductor dies 20 may include one or more thermoelectric chips and the article 100 can be a thermoelectric device. The thermoelectric chips may be made of an n-type semiconductor material (e.g., $Bi_2Te_3$ or its alloys) or a p-type semiconductor material (e.g., $Sb_2Te_3$ or its alloys). In some embodiments, the solid semiconductor dies 20 may include one or more LED chips and the article 100 can be an optoelectronic device.

In some embodiments, the solid semiconductor dies 20 may include electrical contacts (e.g., legs for thermoelectric chips) disposed on the surfaces of at least one of the first and second ends 22 and 24. The electrical contacts of the dies 20 can be electrically connected, e.g., via the first or second electrical conductors 32 and 34, to form an electrical circuits with desired functions.

The solid semiconductor dies 20 are at least partially embedded in the layer 10 of polymeric material. In the depicted embodiment of FIG. 1, the first and second ends 22 and 24 are at least partially exposed from the layer 10 of polymeric material to allow the electronic conductors 32 and 34 to electrically connect the contacts on the first and second ends 22 and 24, respectively.

FIGS. 2A-2F illustrate a process of fabricating the article 100 of FIG. 1, according to one embodiment. A pre-structured tooling 2 is provided with pre-defined cavities 4 on a major surface 6 thereof to receive the solid semiconductor dies 20. The pre-structured tooling 2 can be, for example, a patterned rotary belt, a patterned drum, etc. The placement of the solid semiconductor dies 20 into the cavities 4 can be performed by using, for example, standard "pick and place" equipment, a chip shooter, or a laser-based transfer method. Confining the solid semiconductor dies 20 in the pre-defined cavities 4 on the tooling 2 can be advantageous in that a) it enables precision placement even at higher speeds, and b) it maintains absolute and relative orientation of the solid semiconductor dies 20 on the moving tooling 2 without having to tack them down.

Figure 2A:
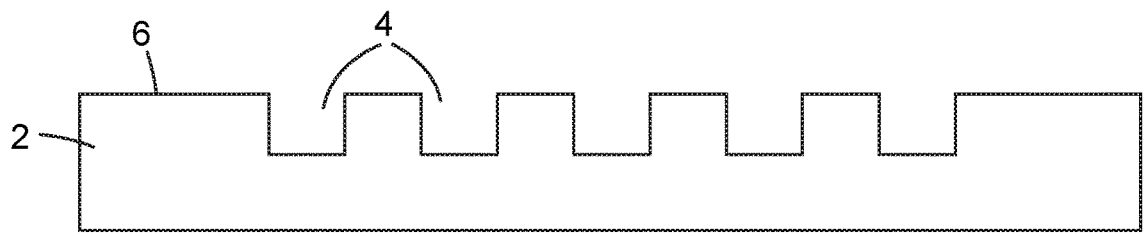
FIG. 2A is a cross sectional view of a pre-structured tooling, according to one embodiment of the present disclosure.
Figure 2B:
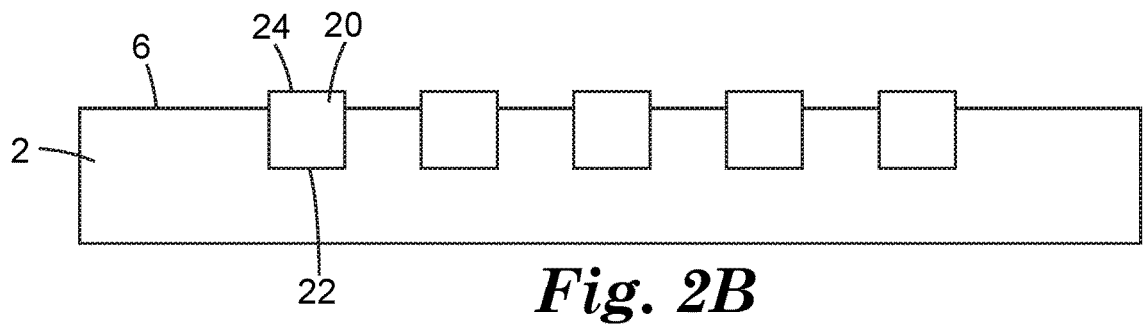
FIG. 2B is a cross sectional view of the pre-structured tooling of FIG. 2A with any array of dies disposed therein, according to one embodiment of the present disclosure.
Figure 2C:
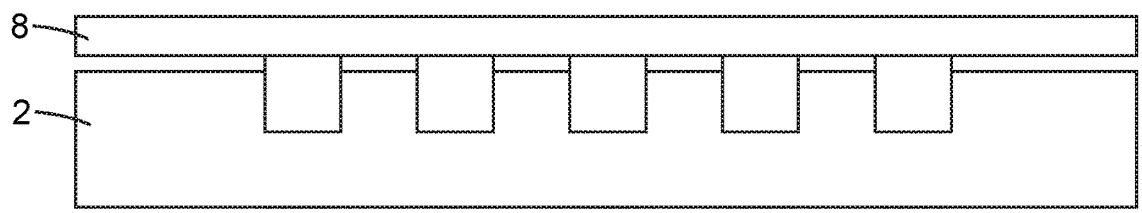
FIG. 2C is a cross sectional view of the dies of FIG. 2B to be transferred from the pre-structured tooling onto an adhesive tape, according to one embodiment of the present disclosure.
Figure 2D:
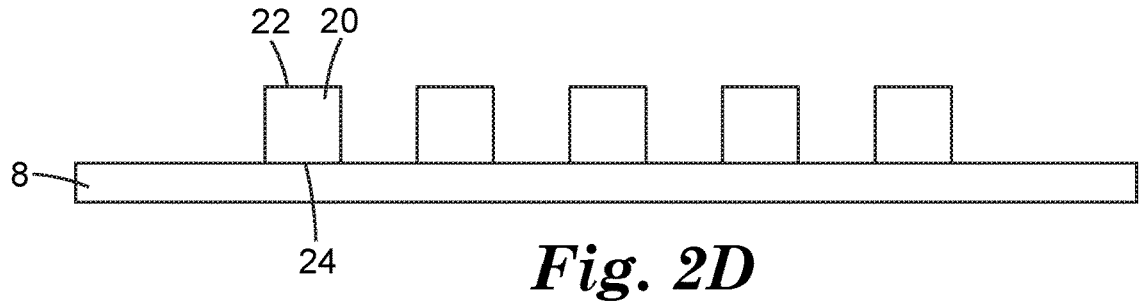
FIG. 2D is a cross sectional view of the dies of FIG. 2C disposed on the adhesive tape, according to one embodiment of the present disclosure.

As shown in FIG. 2B, the solid semiconductor dies 20 are disposed in the cavities 4 of the tool 2. The second ends 24 project away from the major surface 6. The array of solid semiconductor dies 20 is then transferred from the pre-structured tooling 2 to an adhesive tape 8 by contacting the adhesive tape 8 with the second ends 24 of the dies 20, as shown in FIGS. 2C-D. The adhesive tape 8 can be pressed against the major surface 6 of the pre-structured tooling 2. When the adhesive tape 8 is removed from the tooling 2, the dies 20 can be transferred to the adhesive tape 8. The relative orientation of the dies 20 can be maintained on the adhesive tape 8 after the transfer. The adhesive tape 8 can be a substrate coated with a "weak" adhesive such as, for example, a 3M Scotch removable tape. It is to be understood that the adhesive tape 8 can be any suitable holding surface (e.g., an adhesive surface, a patterned surface, etc.) that it can hold the second ends of the dies 20 securely which can be easy to remove later.

Figure 2E:
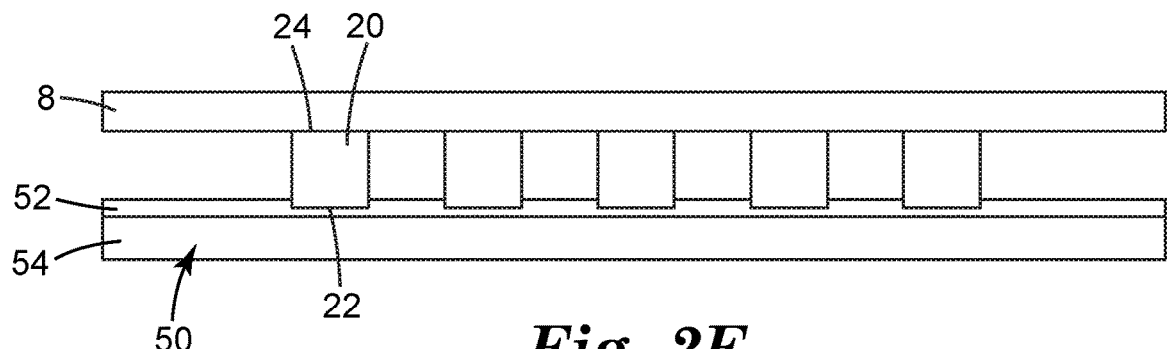
FIG. 2E is a cross sectional view of the dies of FIG. 2D to be transferred from the adhesive tape to a first liner, according to one embodiment of the present disclosure.

A first liner 50 is then provided to contact to the first ends 22 of the dies 20, as shown in FIG. 2E. A liner described herein refers to a substrate having a major surface that is deformable to accommodate a sinking of an end of a solid semiconductor die and is capable of forming a tight seal between the major surface and the end of the die. In addition, the major surface of the liner may have a low surface energy such that a polymeric coating and the dies disposed thereon can be releasable therefrom.

In the depicted embodiment of FIG. 2E, the first liner 50 includes a surface layer 52 disposed on a substrate 54 thereof. The surface layer 52 and the substrate 54 can be made of different materials where the surface layer 52 has a lower melting temperature than the substrate 54. In some embodiments, the first liner 50 can be heated to certain temperatures under which the surface layer 52, not the substrate 54, can be at least partially melt or softened to allow the first ends 22 of the dies 20 to sink into the surface layer 52. The substrate 54 can sustain its stiffness under such temperatures and serve as a stop layer to hold the surface layer 52 and the dies 20 in position. In some embodiments, the first liner may include a layer of polyethylene phthalate and a layer of polyethylene.

Figure 2F:
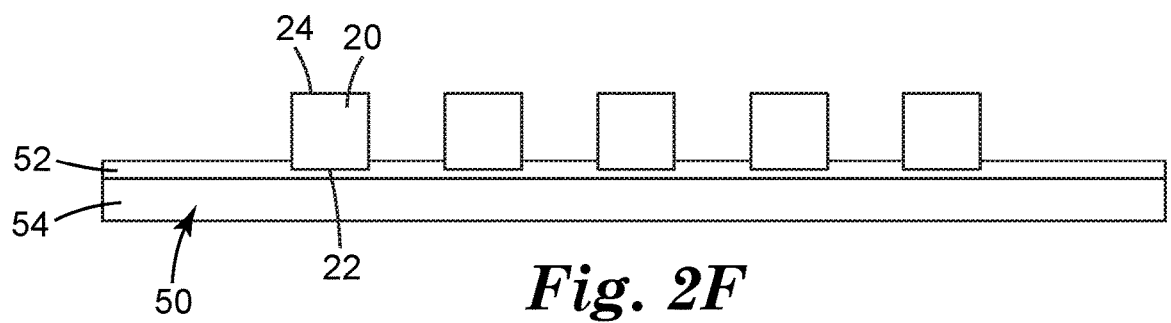
FIG. 2F is a cross sectional view of the dies of FIG. 2E where one end of the dies sinks into a first liner, according to one embodiment of the present disclosure.

In some embodiments, after the first ends 22 of the dies 20 sinking into the major surface of the first liner 50, the major surface can be re-solidified to anchor the array of dies thereon. For example, the first liner 50 can be cooled down, e.g., at room temperature, to re-solidify the surface layer 52. After the array of dies 20 are positioned and secured on the first liner 50, the adhesive tape 8 can be removed and the dies 20 are transferred from the adhesive tape 8 to the first liner 50, as shown in FIG. 2F.

Figure 3A:
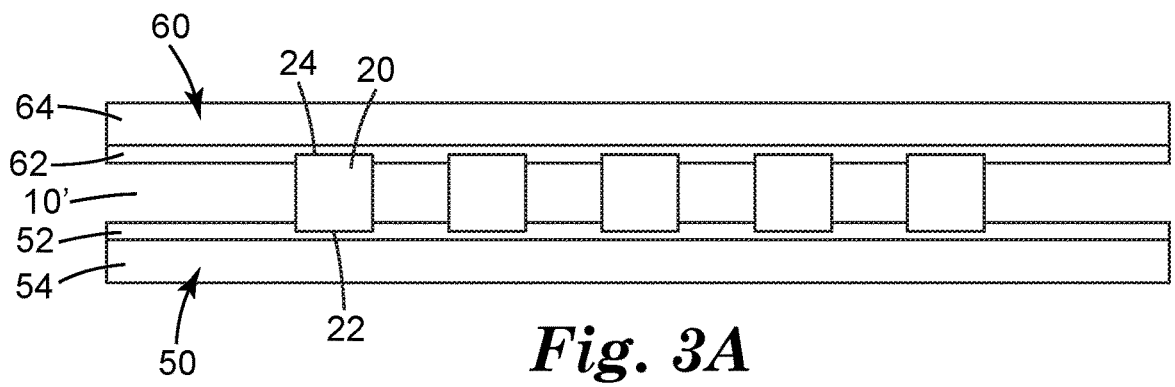
FIG. 3A is a cross sectional view of the dies of FIG. 2F where another end of the dies sinks is in contact with a second liner, according to one embodiment of the present disclosure.

In the embodiment shown in FIG. 3A, a second liner 60 is provided to contact to the second ends 24 of the dies 20. Similar to the first liner 50, the second liner 60 includes a surface layer 62 disposed on a substrate 64 thereof. The surface layer 62 and the substrate 64 of the second liner 60 can be made of different materials where the surface layer 62 has a lower melting temperature than the substrate 64. In some embodiments, the second liner 60 can be heated to certain temperatures under which the surface layer 62, not the substrate 64, can be at least partially melt or softened to allow the second ends 24 of the dies 20 to sink into the surface layer 62. The substrate 64 can sustain its stiffness under such temperatures and serve as a stop layer to hold the surface layer 62 and the dies 20 in position.

Figure 3B:
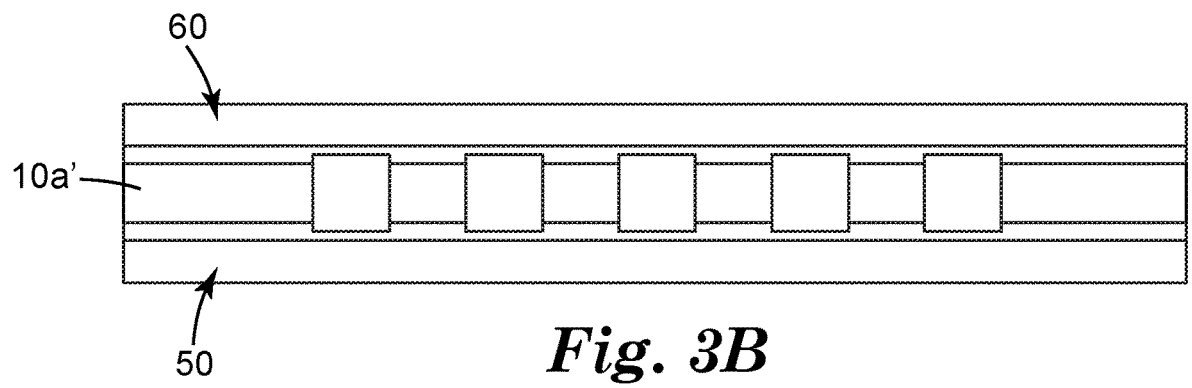
FIG. 3B is a cross sectional view of the dies of FIG. 3A where the space between the first and second liners is filled with a polymer material, according to one embodiment of the present disclosure.

With the first and second ends 22 and 24 of the dies 20 being respectively positioned into the opposite liners 50 and 60, a parallel-plate-like structure is created. The distance between the opposite liners 50 and 60 is substantially determined by the height of the dies 20. The space 10' between the first and second liners 50 and 60 is then filled with a flowable polymeric material 10*a*', as shown in FIG. 3B. The first and second ends 22 and 24 of the dies 20 are protected from the polymeric material 10*a*'.

In some embodiments, the polymeric material 10*a*' can be provided to flow into the space 10'. In some embodiments, a liquid, melt, or semi-molten polymeric material 10*a*' can be provided into the space 10', for example, by dispensing, injecting, printing, etc. In some embodiments, the polymeric material 10*a*' can be a liquid with low viscosity. When the low viscosity liquid approaches an edge of the parallel-plate-like structure, it can flow into the space 10' by capillary pressure. As long as there is continuous supply of the liquid, the liquid front can proceed to completely fill the interstitials between the dies 20. The capillary flow can be aided by the presence of die array 20 between the liners 50 and 60, which form localized fluid channels. The rate of capillary filling may be determined by rheology, surface energetics, height of the dies and their relative orientation, etc.

Figure 3C:
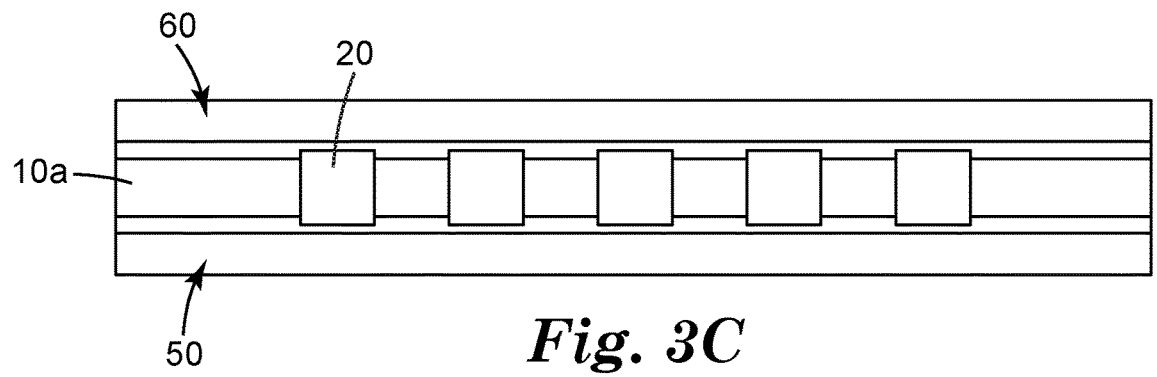
FIG. 3C is a cross sectional view of the dies of FIG. 3B where the polymer material is solidified to form a polymer layer, according to one embodiment of the present disclosure.

Upon complete filling the space 10', the flowable polymeric material 10*a*' can be solidified via, for example, thermal or radiation curing (e.g., UV curing), to form a layer 10*a* of polymeric material. FIG. 3C is a cross sectional view of the parallel-plate-like structure of FIG. 3B where the polymeric material is solidified to form the layer 10*a*. It is to be understood that the flowable polymeric material can be solidified by any other suitable methods or processes.

Figure 3D:
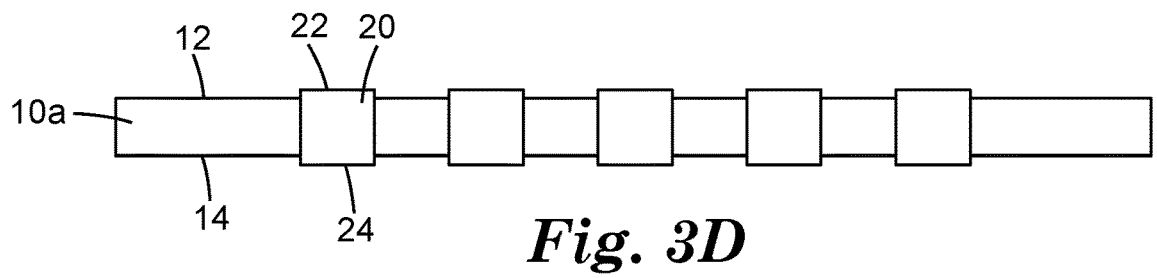
FIG. 3D is a cross sectional view of the dies of FIG. 3C partially embedded in the polymer layer, according to one embodiment of the present disclosure.

After the formation of the layer 10*a*, the first and second liners 50 and 60 are delaminated from the dies 20 and the layer 10*a*. It is to be understood that the liners 50 and 60 may include any suitable materials and configurations as long as that (i) the major surfaces are deformable to accommodate a sinking of an end of a solid semiconductor die and (ii) the liners can be delaminated from the dies and the polymeric layer. FIG. 3D is a cross sectional view of the dies 20 partially embedded in the layer 10*a* of polymeric material. The first and second ends 22 and 24 of the dies 20 are exposed after the removal of the first and second liners 50 and 60. In some embodiments, the first and/or second ends can project away from the respective major surface 12 or 14 of the layer 10*a*.

Figure 3E:
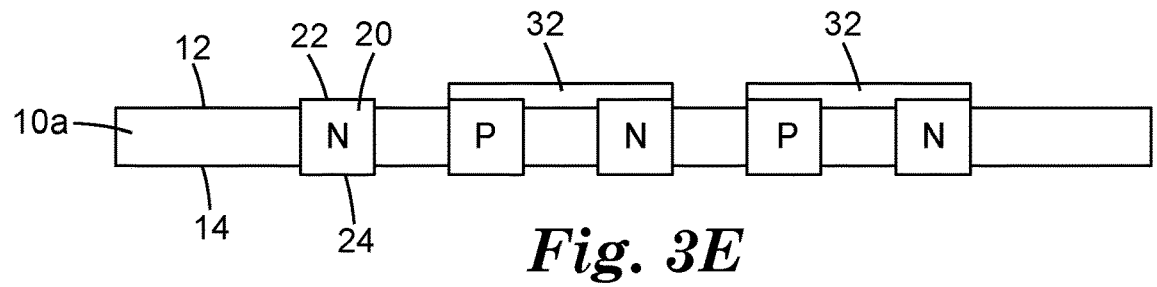
FIG. 3E is a cross sectional view of the dies of FIG. 3D where the first ends of the dies are electrically connected, according to one embodiment of the present disclosure.
Figure 3F:
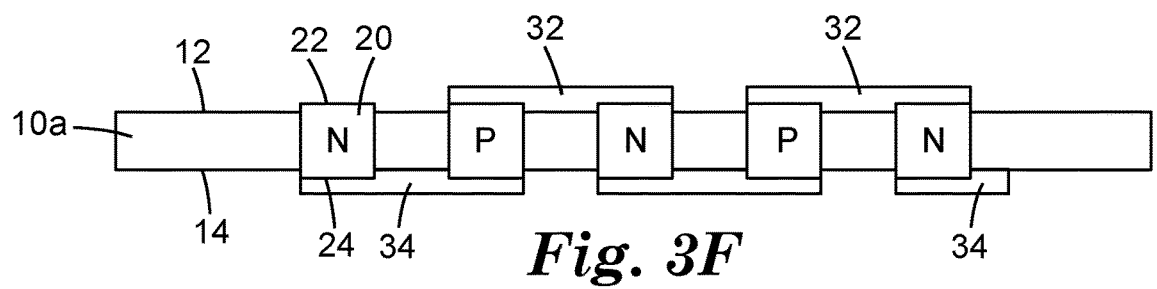
FIG. 3F is a cross sectional view of the dies of FIG. 3E where the second ends of the dies are electrically connected, according to one embodiment of the present disclosure.

The first electrical conductor 32 is provided to electrically connect the contacts on the first ends 22 of the dies 20; the second electrical conductor 34 is provided to electrically connect the contacts on the second ends 24 of the dies 20, as shown in FIGS. 3E-3F. The electrical conductors 32 and 34 can extend between adjacent ends of the dies 22 or 24 on the respective major surfaces 12 and 14 of the layer 10*a*. The electrical conductors 32 and 34 can be formed on the layer 10*a* by any suitable methods. In some embodiments, the smoothness and flatness of the layer 10*a* can facilitate the use of, for example, a printing method, a laminating method, etc.

In the embodiment depicted in FIG. 3F, the solid semiconductor dies 20 include an array of n-type and p-type thermoelectric chips which are electrically connected to form a thermoelectric circuit (e.g., a thermoelectric generator). A direct electric current can flow in the circuit when there is a temperature difference between the opposite ends 22 and 24 of the thermoelectric chips 20.

The electrical conductor 32 or 34 can be formed from a deposited or printed metal pattern. The metal can include, for example, copper, silver, gold, aluminum, nickel, titanium, molybdenum, the combinations thereof, etc. In some embodiments, the metal pattern can be formed by silk screen printing using a metal-composite ink or paste. In other embodiments, the metal pattern can be formed by flexographic printing or gravure printing. In other embodiments, the metal pattern can be formed by ink jet printing. In other embodiments, the metal pattern can be formed by electroless deposition. In other embodiments, the metal can be deposited by means of sputtering or CVD deposition followed by photolithographic patterning. The metal thickness can range, for example, between 1 micron and 100 microns. In some embodiments, the electrical conductors can be printed onto the flat surfaces of the polymer layer 10*a* to connect the respective ends of the dies 20. In some embodiments, the electrical conductors can be formed by laminating a patterned metal tape (e.g., Cu tape), or by electroless deposition of metals. It is to be understood that the electrical conductors can be formed by any suitable methods to electrically connect the respective ends of the dies 20.

In some embodiments, the end surface of the semiconductor dies 20 can be further cleaned before providing the electrical conductors 32 and 34 thereon. Methods of cleaning can include, for example, solvent rinse, acid rinse with ultrasound, abrasion with sandpaper or by sandblasting, high pressure water spray, sputter clean, plasma clean, etc. Such cleaning can improve the quality of electrical contacts.

Figure 4A:
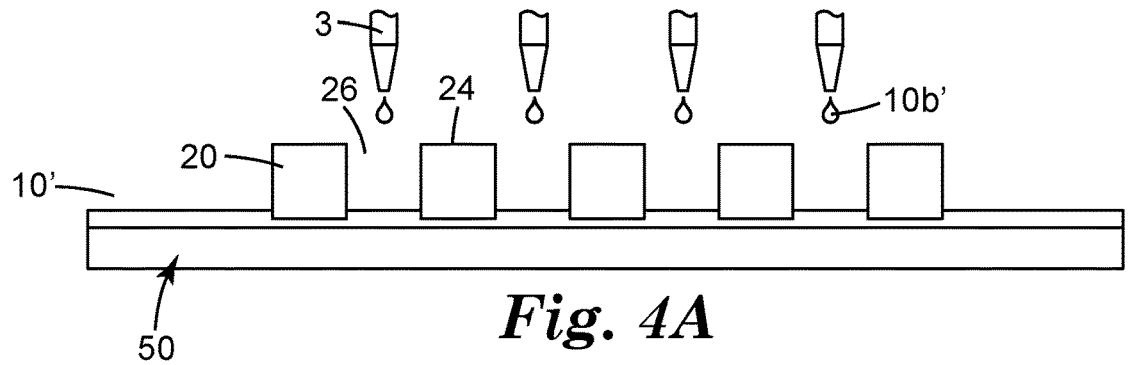
FIG. 4A is a cross sectional view of the dies of FIG. 2F with one end sinking into the first liner where the space between the dies is filled with an ink material by inkjet printing, according to one embodiment of the present disclosure.

When the dies 20 have the first ends 22 positioned into the first liner 50, as shown in FIG. 2F, a polymer layer can be formed directly on the first liner 50 to fill the space 10' thereon. In the embodiment depicted in FIG. 4A, the interstitials 26 between the solid semiconductor dies 20 are filled with an ink material 10*b*' dispensed by inkjet printing 3. Driven by a capillary pressure, the ink 10*b*' may travel a certain distance from each dispensing site, which may depend on rheology, surface energetics and/or die geometry. Fresh ink can be dispensed at periodic sites along the width of the substrate to ensure a continuous coverage of the interstitials 26 between the dies 20.

Figure 4B:
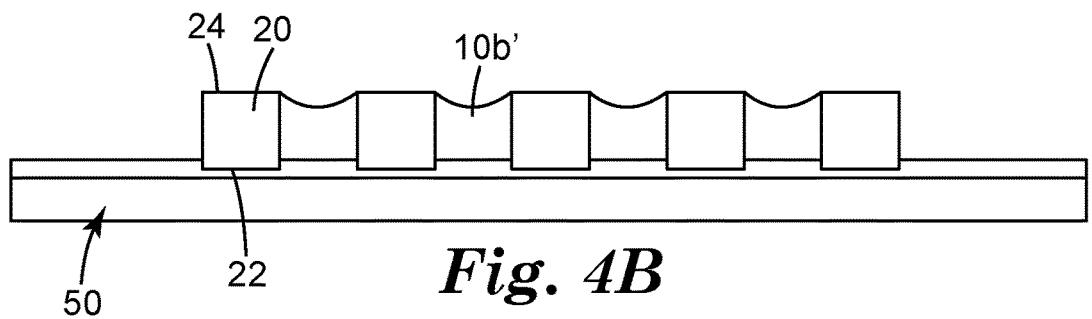
FIG. 4B is a cross sectional view of the dies of FIG. 4A where the space between the dies is filled with an ink material by inkjet printing, according to one embodiment of the present disclosure.

In some embodiments, the ink can be provided in a suitable amount with suitable properties such that while the ink advances in the spaces/interstitials between the dies 20, it can be confined to below a level defined by the upper edges of the dies 20 due to pinning effects, as shown in FIG. 4B. The ink 10*b*' may not flow onto or cover the second ends 24 of the dies 20. Upon complete filling, the first liner 50 and the supported dies 20 and ink 10*b*' can be passed through a lamination nip to flatten the ink surface profile before the solidification step.

Figure 5A:
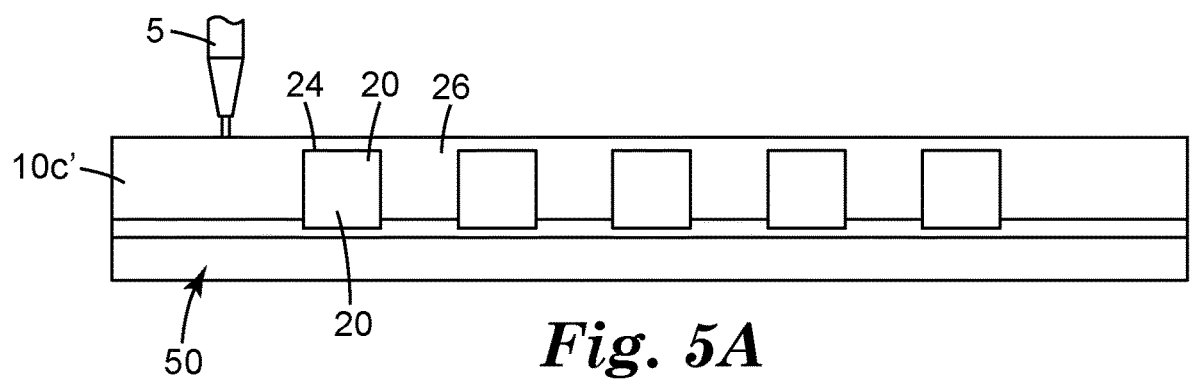
FIG. 5A is a cross sectional view of the dies of FIG. 2F with one end sinking into the first liner where the space between the dies is filled with a polymer material by coating, according to one embodiment of the present disclosure.
Figure 5B:
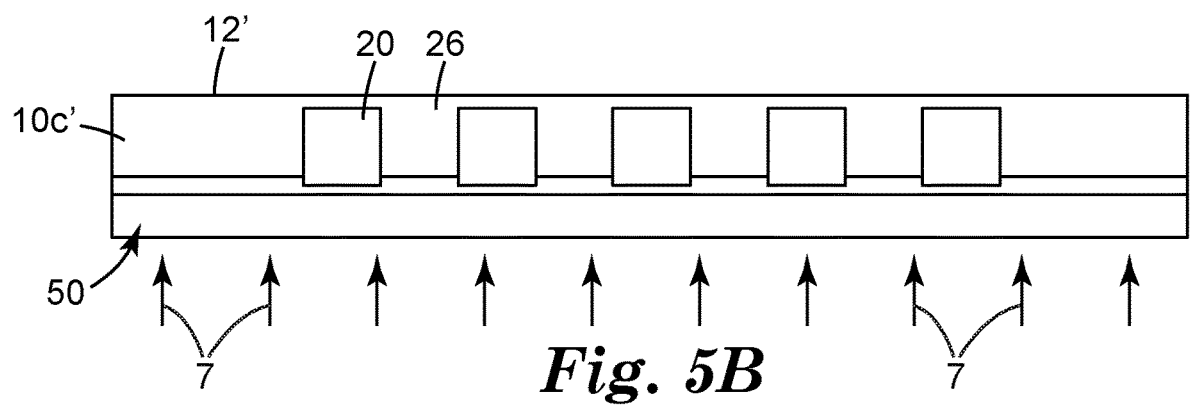
FIG. 5B is a cross sectional view of the dies of FIG. 5A where the polymer material is solidified by curing from one side to form a polymer layer, according to one embodiment of the present disclosure.
Figure 5C:
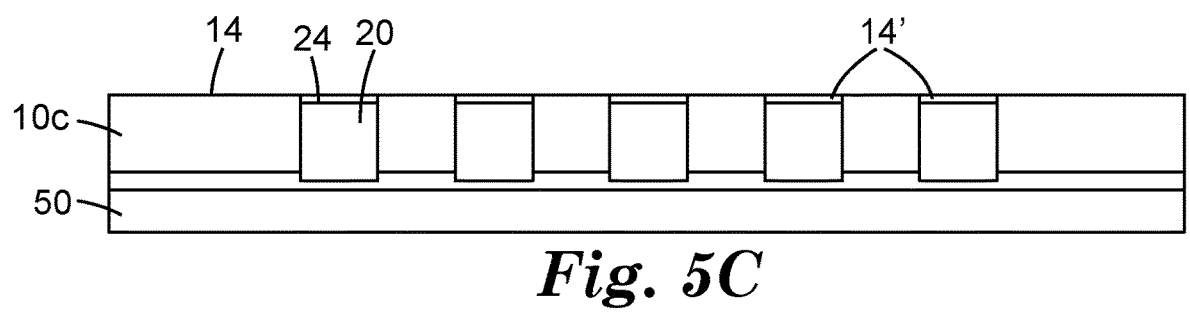
FIG. 5C is a cross sectional view of the dies of FIG. 5B with uncured polymer material to be removed, according to one embodiment of the present disclosure.
Figure 5D:
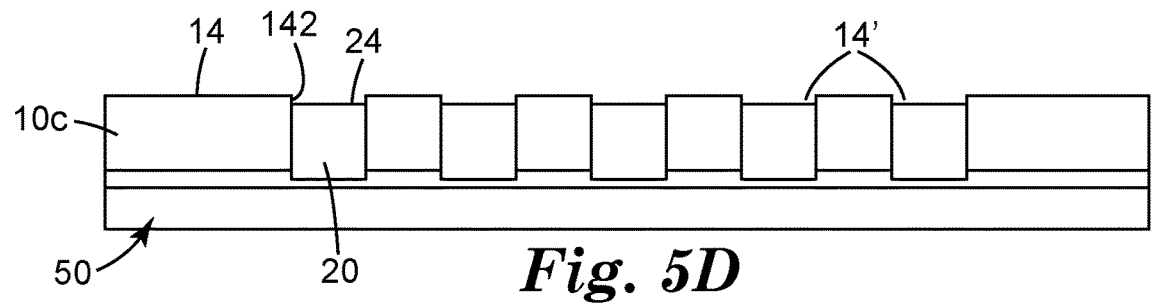
FIG. 5D is a cross sectional view of the dies of FIG. 5C where the uncured polymer material is washed away, according to one embodiment of the present disclosure.
Figure 5E:
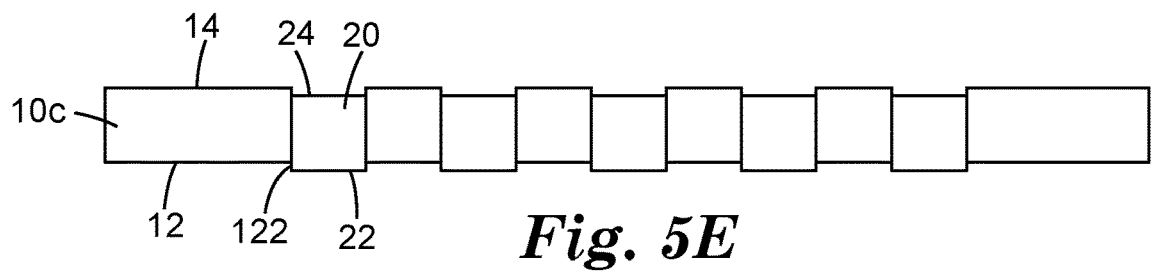
FIG. 5E is a cross sectional view of the dies of FIG. 5E where the first liner is delaminated from the first ends of the dies, according to one embodiment of the present disclosure.

In the embodiment depicted in FIG. 5A, a flowable polymer material 10*c*' is directly coated, via a coating apparatus 5, onto the first liner 50 to fill in the interstitials 26 between the dies 20. The polymer material 10c' can be coated to completely cover the dies 20, i.e., the level 12' of the polymer material 10c' being higher than the ends 24 of the dies 20. The polymer material 10c' is then cured by radiation 7 from the backside of the dies 20 to form a layer 10c of polymeric material. The radiation 7 can be, for example, a collimated UV-illumination. The dies 20 can block the radiation from curing the portion 14' of polymer material on the second ends 24 of the dies 20. The uncured material 14' can be removed (e.g., by washing) to expose the second ends 24 of the dies 20 after the formation of the layer 10c. After the removal of the uncured material 14', an indent 142 can be formed from the second major surface 14 of the layer 10c to the second ends 24 of the dies 20 as shown in FIG. 5D. The indent 142 may have a dimension of, for example, about 1 to about 100 microns, about 1 to about 50 microns, about 1 to about 25 microns, or about 2 to about 25 microns. After the removal of the first liner 50, the first ends 22 of the dies 22 can be exposed. The first ends 22 project away from the first major surface 12 of the layer 10c with a step 122. The step 122 may have a dimension of, for example, about 1 to about 100 microns, about 1 to about 50 microns, about 1 to about 25 microns, or about 2 to about 25 microns.

Figure 6A:
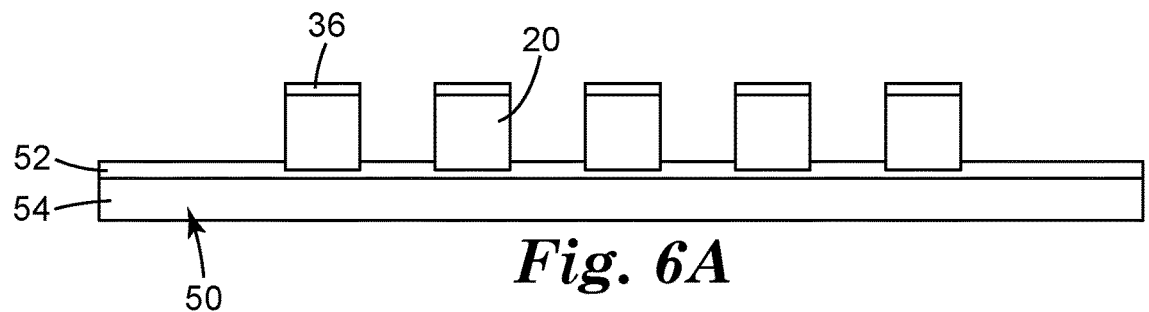
FIG. 6A is a cross sectional view of the dies of FIG. 2F where a conductive low-surface energy material is coated on the second ends of the dies, according to one embodiment of the present disclosure.
Figure 6B:
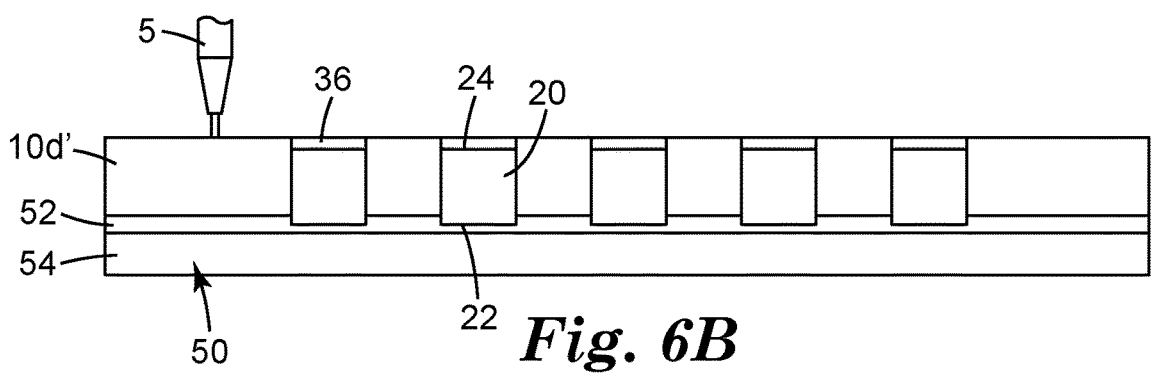
FIG. 6B is a cross sectional view of the dies of FIG. 6A the space between the dies is filled with a polymer material by coating, according to one embodiment of the present disclosure.
Figure 6C:
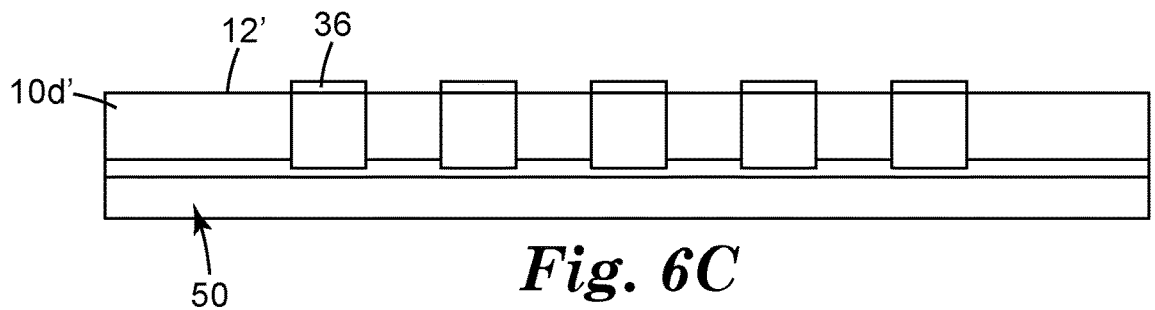
FIG. 6C is a cross sectional view of the dies of FIG. 6B where the polymer material de-wets from the second ends of the dies, according to one embodiment of the present disclosure.
Figure 6D:
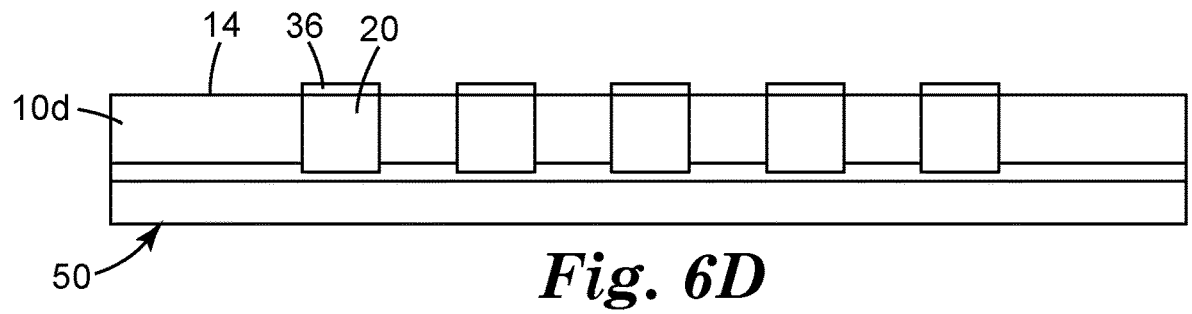
FIG. 6D is a cross sectional view of the dies of FIG. 6C where the polymer material is solidified to form a polymer layer, according to one embodiment of the present disclosure.
Figure 6E:
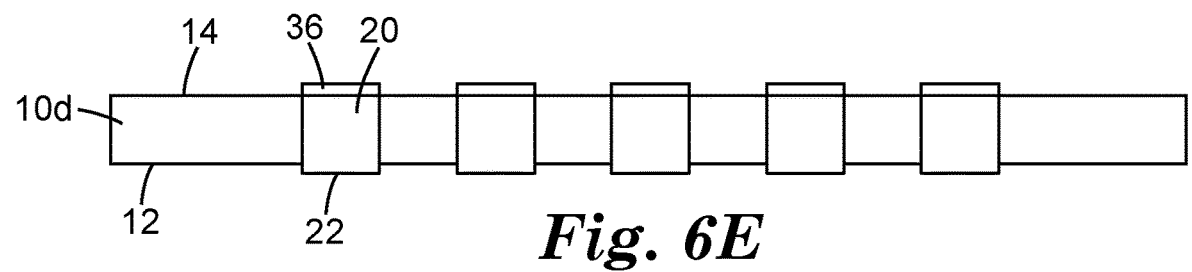
FIG. 6E is a cross sectional view of the dies of FIG. 6D where the first liner is delaminated from the first ends of the dies, according to one embodiment of the present disclosure.
Figure 6F:
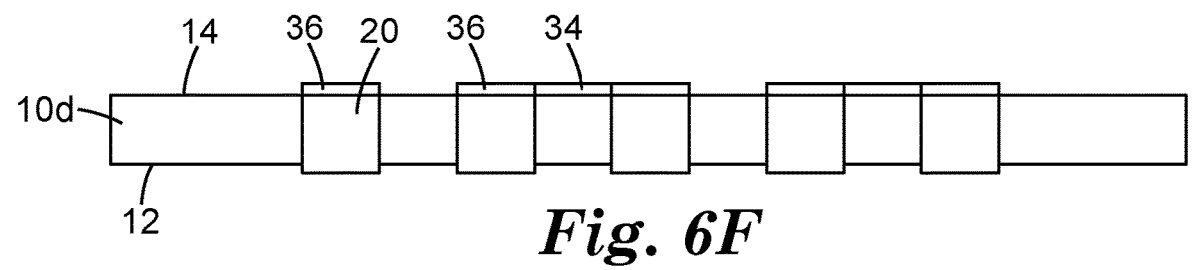
FIG. 6F is a cross sectional view of the dies of FIG. 6E where the second ends of the dies are electrically connected, according to one embodiment of the present disclosure.
Figure 6G:
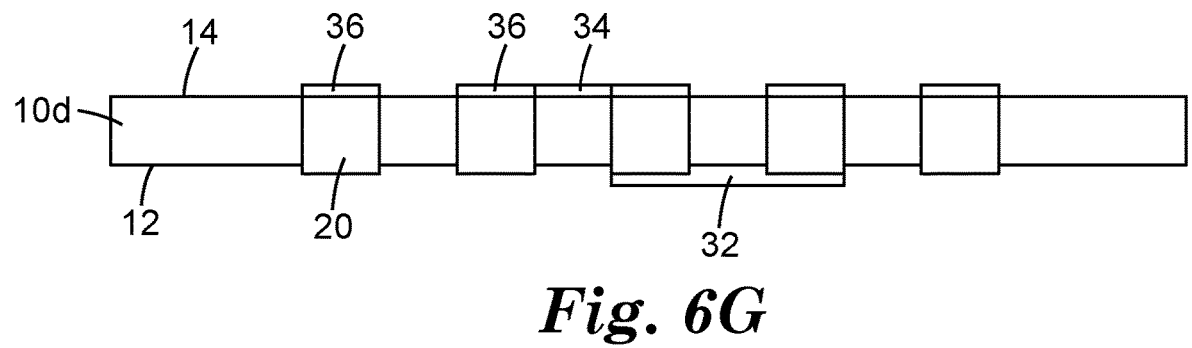
FIG. 6G is a cross sectional view of the dies of FIG. 6F where the first ends of the dies are electrically connected, according to one embodiment of the present disclosure.

In the embodiment depicted in FIG. 6A, an electrically conductive coating 36 is provided on the second ends 24 of the dies 20. The electrically conductive coating 36 can be made of a low-surface energy material such as, for example, a silicone-based silver ink. Any suitable methods can be used to form the electrically conductive coating 36 such as, for example, by flexographically printing the top surface of the dies using a flat stamp. A flowable polymer material 10d' can be coated, via a coating apparatus 5, onto the first liner 50. The coated polymer material 10d' can de-wet from the conductive coating 36 when it approaches the ends 24 of the dies 20, as shown in FIGS. 6B-C. The level 12' of the coated polymer 10d' can be substantially equal or lower than the conductive coating 36. The polymer material 10d' is then solidified to form a polymer layer 10d, as shown in FIG. 6D. The first liner 50 is removed to expose the first ends 22 of the dies 20, which are electrically connected by the first electrical conductor 32, as shown in FIG. 6G. The electrically conductive coating 36 on the second ends 24 of the dies are electrically connected by the second electrical conductor 34, as shown in FIGS. 6F-6G. In some embodiments, when the electrically conductive coating 36 is thin (e.g., thinner than the first electrical conductor 32), the second electrical conductor 34 can be made to cover the electrically conductive coating 36.

The present disclosure provides processes for making flexible electronic devices (e.g., thermoelectric devices). The processes of fabricating flexible electronic devices described herein can include a roll-to-roll (R2R) process, which can effectively reduce the thickness of electronic film devices, provide flexible, large-area electronic devices, and reduce the processing cost.

The operation of the present disclosure will be further described with regard to the following embodiments. These embodiments are offered to further illustrate the various specific and preferred embodiments and techniques. It should be understood, however, that many variations and modifications may be made while remaining within the scope of the present disclosure.

Listing of Exemplary Embodiments

It is to be understood that any one of embodiments 1-18, 19-25, and 26-27 can be combined.

Embodiment 1 is a method comprising:
providing an array of solid semiconductor dies each extending between a first end and an opposite, second end thereof;
sinking the first ends of the dies into a major surface of a first liner;
filling a flowable polymeric material onto the major surface of the first liner;
solidifying the polymeric material to form a layer of polymeric matrix material, wherein the array of solid semiconductor dies are at least partially embedded in the layer;
delaminating the first liner from the first ends of the dies; and
electrically connecting the first ends of the dies.

Embodiment 2 is the method of embodiment 1 further comprising providing a second liner in contact with the array of dies at the second ends thereof on the side opposite to the first liner.

Embodiment 3 is the method of embodiment 1 or 2, wherein solidifying the polymeric material comprises thermal or radiation curing.

Embodiment 4 is the method of any one of embodiments 1-4 further comprising electrically connecting the second ends of the array of dies.

Embodiment 5 is the method of embodiment 3 or 4, wherein the polymeric material is cured from the side of the first ends, and an uncured material at the second ends is removed after curing.

Embodiment 6 is the method of any one of embodiments 1-5, wherein filling the flowable polymeric material comprises filling the space between the dies with the polymeric material by a capillary force.

Embodiment 7 is the method of any one of embodiments 1-6, wherein filling the flowable polymeric material comprises filling the space between the dies by inkjet printing.

Embodiment 8 is the method of any one of embodiments 1-7, further comprising coating an electrically conductive, low-surface energy material on the second ends of the array of dies on the side opposite to the first liner.

Embodiment 9 is the method of any one of embodiments 1-8, wherein providing the array of dies comprises disposing the array of dies into a pre-structured tooling, the second ends of the array of dies project away from the pre-structured tooling.

Embodiment 10 is the method of embodiment 9, wherein providing the array of dies further comprises transferring the array of dies from the pre-structured tooling onto an adhesive tape.

Embodiment 11 is the method of embodiment 10, wherein providing the array of dies further comprises transferring the array of dies from the adhesive tape to the first liner.

Embodiment 12 is the method of any one of embodiments 1-11, further comprising melting the major surface of the first liner to allow the first ends of the array of dies to sink into the major surface under a pressure.

Embodiment 13 is the method of embodiment 12, wherein the first ends of the array of dies sink into the major surface of the first liner with an average depth of about 0.5 to about 10 microns.

Embodiment 14 is the method of any one of embodiments 1-13, wherein the first liner has at least two layers, each layer having a different melting point, such that the layer with the lower melting point faces the array of dies; and further comprising heating the layer with the lower melting point past a softening point thereof such that the first ends of the dies are submerged in the layer with the lower melting point.

Embodiment 15 is the method of embodiment 14, wherein the first liner comprises a layer of polyethylene phthalate and a layer of polyethylene as the layer with the lower melting point.

Embodiment 16 is the method of embodiment 12, further comprising re-solidifying the major surface of the first liner to anchor the array of dies thereon.

Embodiment 17 is the method according to embodiment 3, wherein the flowable polymeric material includes a polyurethane acrylate, a polydimethylsiloxane, or a polyurethane rubber.

Embodiment 18 is the method according to any one of embodiments 1-17, further comprising cleaning the first ends of the dies prior to electrically connecting the first ends of the dies.

Embodiment 19 is an electronic film device comprising:
a layer of polymer matrix material, the layer having opposite first and second major surfaces;
an array of solid semiconductor dies being at least partially embedded in the layer, the dies each extending between a first end and a second end thereof, the first ends projecting away from the first major surface of the layer; and
a first electrical conductor connecting the first ends of the array of dies.

Embodiment 20 is the electronic film device of embodiment 19 further comprises a second electrical conductor connecting the second ends of the array of thermoelectric chips.

Embodiment 21 is the electronic film device of embodiment 20, wherein the first or second electrical conductor has a least a portion directly disposed on the first or second major surface of the layer.

Embodiment 22 is the electronic film device of any one of embodiments 19-21, wherein the layer of polymer matrix material is a curing product of a curable polymeric material.

Embodiment 23 is the electronic film device of embodiment 22, wherein the curable polymeric material includes a polyurethane acrylate, a polydimethylsiloxane, or a polyurethane rubber.

Embodiment 24 is the electronic film device of any one of embodiments 19-23, wherein the layer of polymer matrix material is a flexible layer.

Embodiment 25 is the electronic film device of any one of embodiments 19-24, wherein the array of solid semiconductor dies includes an n-type thermoelectric die and a p-type thermoelectric die.

Embodiment 26 is a flexible thermoelectric module comprising:
a layer of flexible polymer material, the layer having opposite first and second major surfaces;
an array of solid thermoelectric dies being at least partially embedded in the layer, the dies each extending between a first end and a second end thereof, both ends being exposed from the layer of flexible polymer material, at least one of the first and second ends projecting away from the layer;
a first electrical conductor extending on the first major surface of the layer to connect the first ends of the array of dies; and
a second electrical conductor extending on the first major surface of the layer to connect the second ends of the array of dies.

Embodiment 27 is the flexible thermoelectric module of embodiment 26, wherein the first ends of the dies project away from the first major surface of the layer.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method comprising:
providing an array of solid semiconductor dies each extending between a first end and an opposite, second end thereof;
sinking the first ends of the dies into a major surface of a first liner;
filling a flowable polymeric material onto the major surface of the first liner;
solidifying the polymeric material to form a layer of polymeric matrix material, wherein the array of solid semiconductor dies is at least partially embedded in the layer of polymeric matrix material;
delaminating the first liner from the first ends of the dies; and
electrically connecting the first ends of the dies,
wherein solidifying the polymeric material comprises thermal or radiation curing, and
wherein the polymeric material is cured from the side of the first ends, and an uncured material at the second ends is removed after curing.

2. The method of claim 1 further comprising providing a second liner in contact with the array of dies at the second ends thereof on the side opposite to the first liner.

3. The method of claim 1 further comprising electrically connecting the second ends of the array of dies.

4. The method of claim 1 further comprising coating an electrically conductive, low-surface energy material on the second ends of the array of dies on the side opposite to the first liner.

5. The method of claim 1, wherein providing the array of dies comprises disposing the array of dies into a pre-structured tooling, the second ends of the array of dies project away from the pre-structured tooling.

6. The method of claim 1 further comprising melting the major surface of the first liner to allow the first ends of the array of dies to sink into the major surface under a pressure.

7. The method of claim 1, wherein the first liner has at least two layers, each layer having a different melting point, such that the layer with the lower melting point faces the array of dies; and further comprising heating the layer with the lower melting point past a softening point thereof such that the first ends of the dies are submerged in the layer with the lower melting point.

8. The method of claim 7, wherein the first liner comprises a layer of polyethylene phthalate and a layer of polyethylene as the layer with the lower melting point.

9. The method according to claim 1, wherein the flowable polymeric material includes a polyurethane acrylate, a polydimethylsiloxane, or a polyurethane rubber.

10. An electronic film device comprising:
a layer of polymer matrix material, the layer having opposite first and second major surfaces;
an array of solid semiconductor dies being at least partially embedded in the layer, the dies each extending between a first end and a second end thereof, the first ends each having a projected portion projecting away from the first major surface of the layer with a step having an average height of about 1 to about 25 micrometers; and
a first electrical conductor connecting the first ends of the array of dies, the first electoral conductor extending on the first major surface of the layer and having opposite ends covering the projected portions of the adjacent first ends.

11. The electronic film device of claim 10 further comprising a second electrical conductor connecting the second ends of the array of solid semiconductor dies.

12. The electronic film device of claim 11, wherein the first or second electrical conductor has a least a portion directly disposed on the first or second major surface of the layer.

13. The electronic film device of claim 10, wherein the layer of polymer matrix material is a curing product of a curable polymeric material.

14. The electronic film device of claim 13, wherein the curable polymeric material includes a polyurethane acrylate, a polydimethylsiloxane, or a polyurethane rubber.

15. The electronic film device of claim 10, wherein the layer of polymer matrix material is a flexible layer.

16. The electronic film device of claim 10, wherein the array of solid semiconductor dies includes at least one n-type thermoelectric die and at least one p-type thermoelectric die.

17. A flexible thermoelectric module comprising:
a layer of flexible polymer material, the layer having opposite first and second major surfaces;
an array of solid thermoelectric dies being at least partially embedded in the layer, the dies each extending between a first end and a second end thereof, both ends being exposed from the layer of flexible polymer material, at least one of the first and second ends each having a projected portion projecting away from the layer with a step having an average height of about 1 to about 25 micrometers;
a first electrical conductor extending on the first major surface of the layer to connect the first ends of the array of dies, the first electoral conductor having opposite ends to cover the projected portions of the adjacent first ends; and
a second electrical conductor extending on the second major surface of the layer to connect the second ends of the array of dies, the second electoral conductor having opposite ends to cover the projected portions of the adjacent second ends.

18. The flexible thermoelectric module of claim 17, wherein the first ends of the dies project away from the first major surface of the layer.

* * * * *